(12) United States Patent
Ueda et al.

(10) Patent No.: US 8,669,628 B2
(45) Date of Patent: Mar. 11, 2014

(54) MAGNETORESISTIVE ELEMENT AND MAGNETIC MEMORY USING THE SAME

(75) Inventors: Koji Ueda, Kamakura (JP); Katsuya Nishiyama, Yokohama (JP); Toshihiko Nagase, Yokohama (JP); Daisuke Watanabe, Yokohama (JP); Eiji Kitagawa, Yokohama (JP); Tadashi Kai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,072

(22) Filed: Mar. 19, 2012

(65) Prior Publication Data

US 2013/0001713 A1    Jan. 3, 2013

(30) Foreign Application Priority Data

Jun. 30, 2011    (JP) .................................. 2011-146329

(51) Int. Cl.
*H01L 29/82*    (2006.01)

(52) U.S. Cl.
USPC ........ 257/421; 257/295; 257/3; 257/E29.323; 438/3; 365/158

(58) Field of Classification Search
None
See application file for complete search history.

(56) References Cited

U.S. PATENT DOCUMENTS

| 7,663,197 | B2 | 2/2010 | Nagase et al. |
| 8,036,025 | B2 | 10/2011 | Nagase et al. |
| 2002/0054462 | A1* | 5/2002 | Sun et al. ................... 360/324.2 |
| 2007/0086121 | A1* | 4/2007 | Nagase et al. ............. 360/324.1 |
| 2009/0079018 | A1* | 3/2009 | Nagase et al. ............... 257/421 |
| 2010/0080050 | A1 | 4/2010 | Ozeki et al. |
| 2012/0008381 | A1 | 1/2012 | Nagase et al. |

FOREIGN PATENT DOCUMENTS

JP    2010-080746    4/2010

OTHER PUBLICATIONS

Ikeda, et al., A perpendicular-anisotropy CoFeB—MgO magnetic tunnel junction, Nature Materials, Jul. 11, 2010, pp. 1-4.

\* cited by examiner

*Primary Examiner* — Michelle Mandala
*Assistant Examiner* — Shaka White
(74) *Attorney, Agent, or Firm* — Knobbe Martens Olson & Bear LLP

(57) ABSTRACT

According to one embodiment, a magnetoresistive element includes the following configuration. First nonmagnetic layer is provided between the first magnetic layer (storage layer) and the second magnetic layer (reference layer). Third magnetic layer is formed on a surface of the storage layer, which is opposite to a surface on which the first nonmagnetic layer is formed. Fourth magnetic layer is formed on a surface of the reference layer, which is opposite to a surface on which the first nonmagnetic layer is formed. The third and fourth magnetic layers have a magnetization antiparallel to the magnetization of the storage layer. Second nonmagnetic layer is located between the storage and third magnetic layers. Third nonmagnetic layer is located between the reference and fourth magnetic layers. The thickness of the fourth magnetic layer is smaller than that of the third magnetic layer.

14 Claims, 7 Drawing Sheets

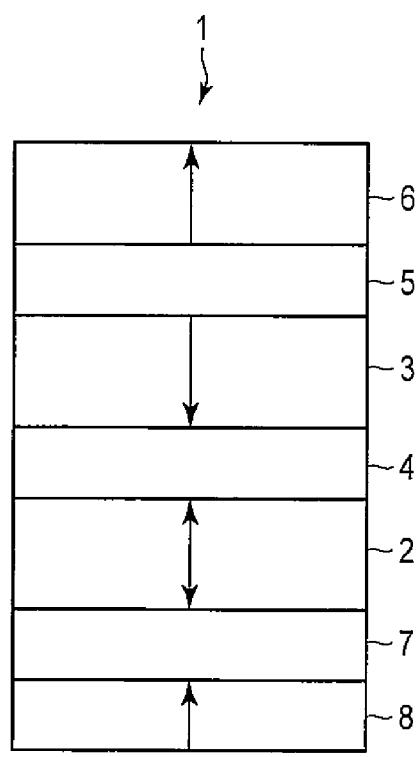
F I G. 1
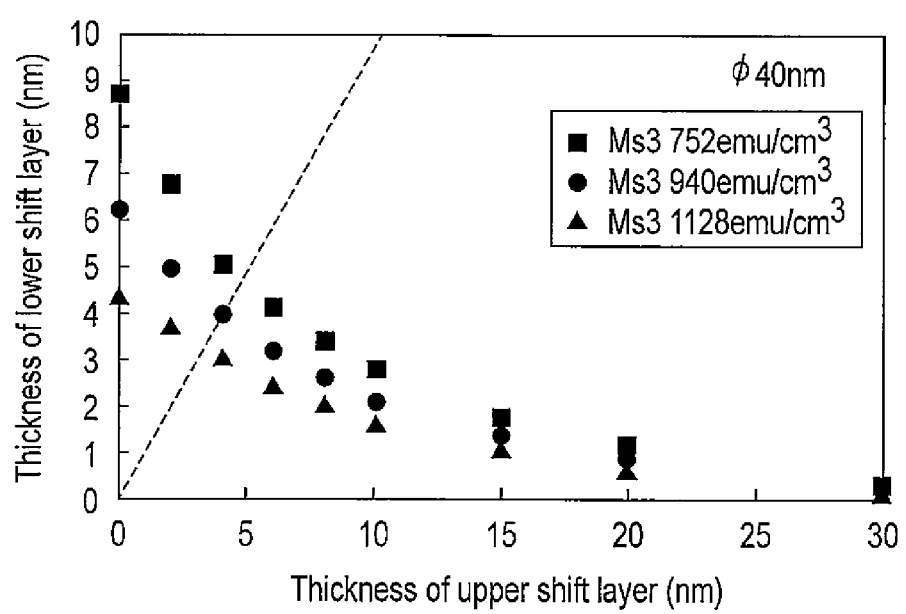
F I G. 2

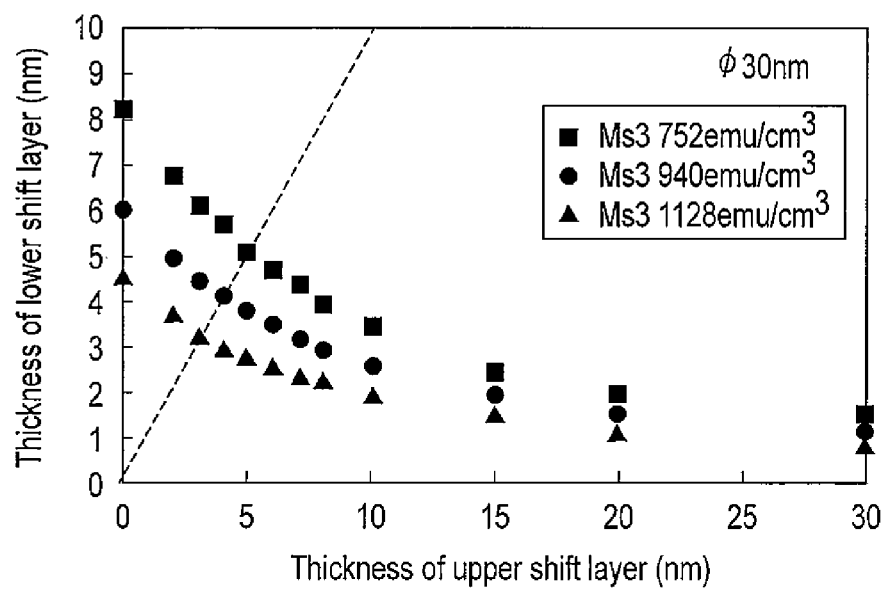
F I G. 3
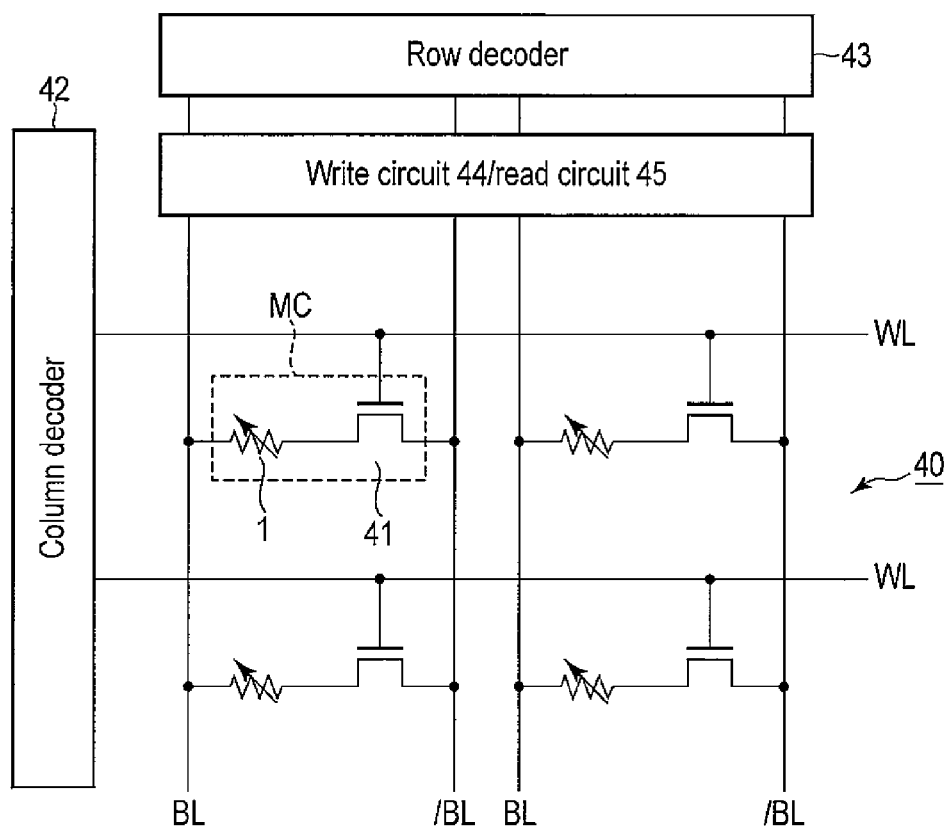
F I G. 4

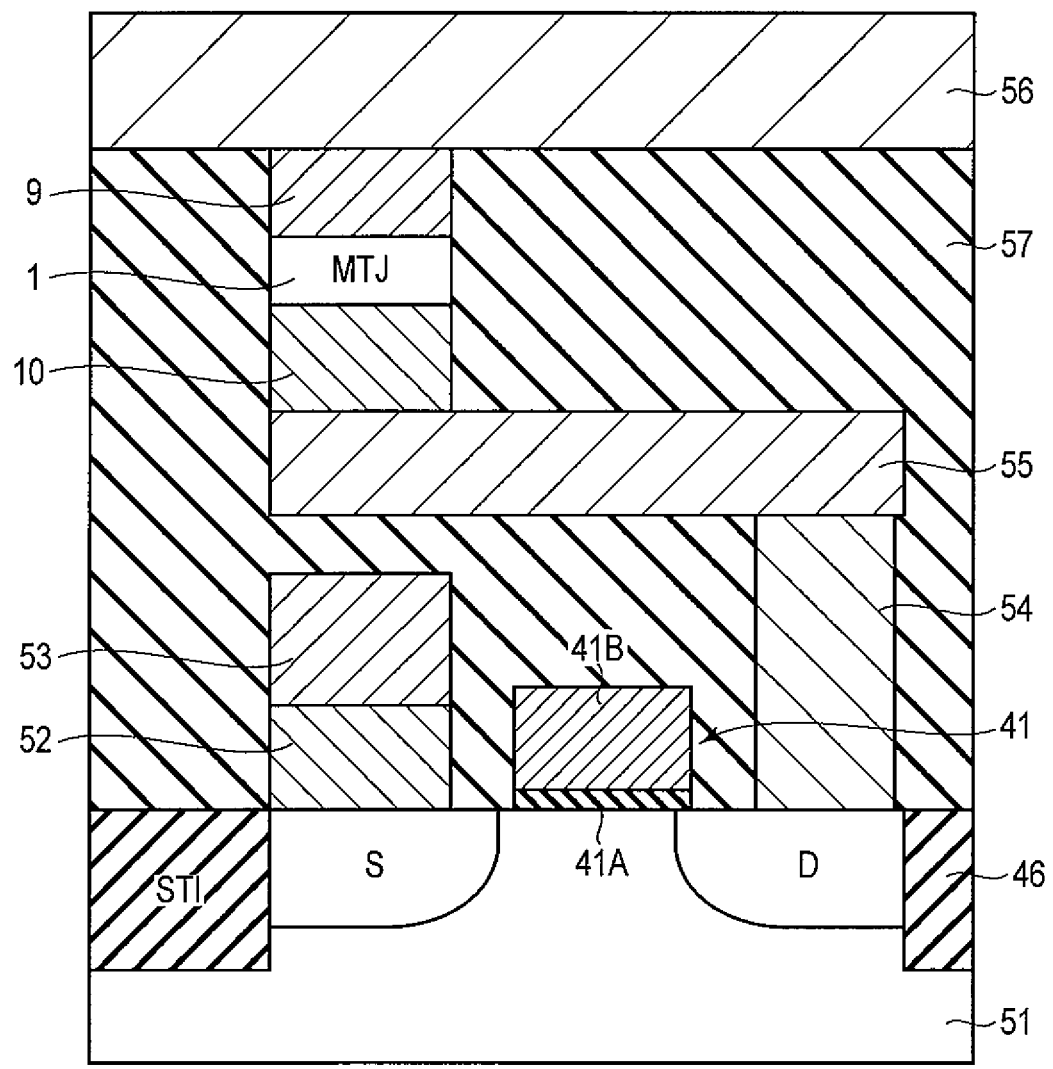
F I G. 5

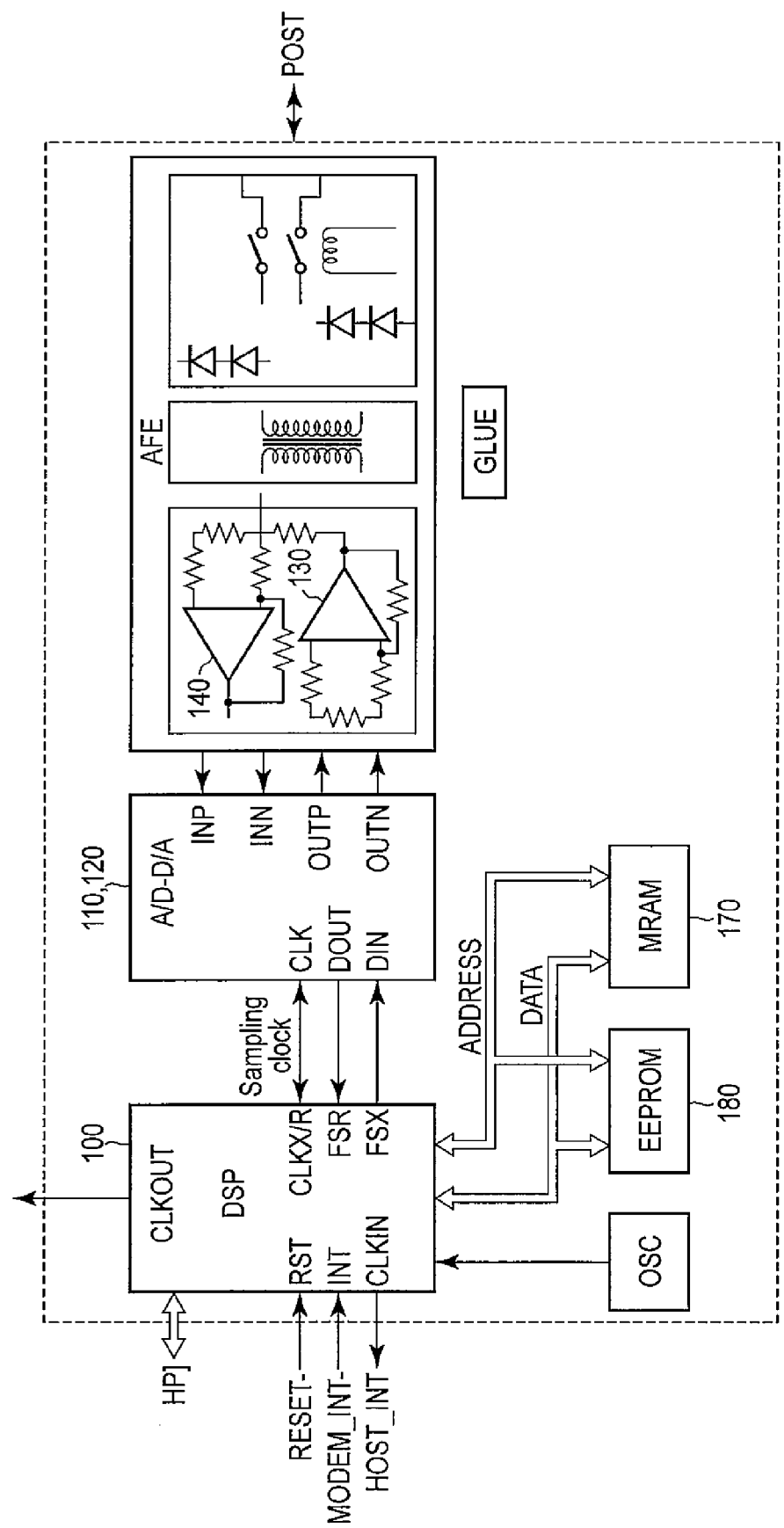
F I G. 6

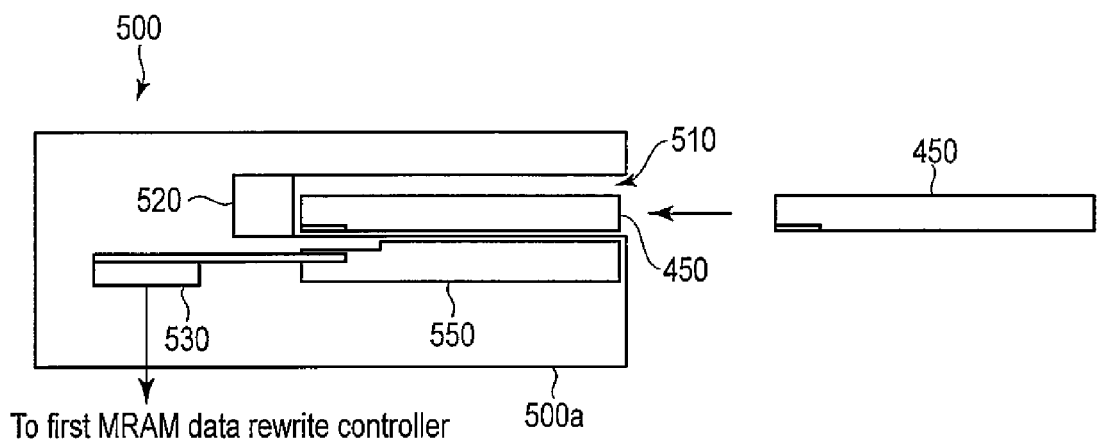
F I G. 10
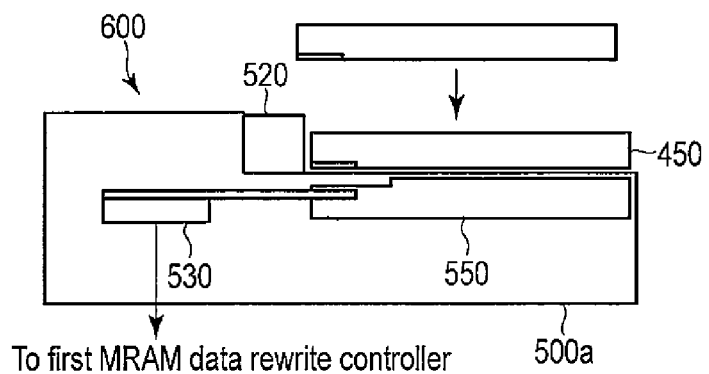
F I G. 11
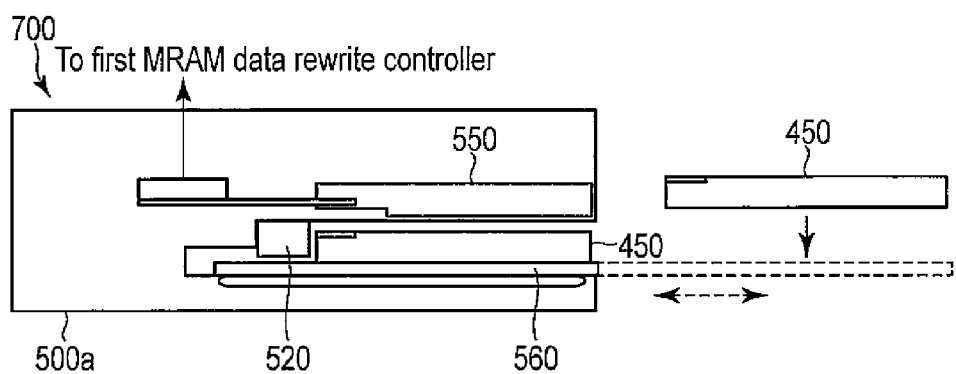
F I G. 12

MAGNETORESISTIVE ELEMENT AND MAGNETIC MEMORY USING THE SAME

CROSS-REFERENCE TO RELATED APPLICATIONS

This application is based upon and claims the benefit of priority from prior Japanese Patent Application No. 2011-146329, filed Jun. 30, 2011, the entire contents of which are incorporated herein by reference.

FIELD

Embodiments described herein relate generally to a magnetoresistive element capable of recording information, for example, by bi-directionally supplying a current, and a magnetic memory using the magnetoresistive element.

BACKGROUND

A magnetoresistive element having a ferromagnetic tunnel junction is also called a magnetic tunnel junction (MTJ) element. As a writing method for this element, a writing (spin transfer torque writing) method that uses spin-momentum-transfer (SMT) has been proposed.

It has been considered to use, as a ferromagnetic material that forms the magnetoresistive element, what is known as a perpendicular magnetization film having a magnetization easy axis (an axis of easy magnetization) in a direction perpendicular to a film plane. When magnetocrystalline anisotropy is used in a perpendicular magnetization configuration, shape anisotropy is not used, so that the element shape can be smaller than that of an in-plane magnetization configuration. Dispersion in a magnetization easy direction can also be reduced. Therefore, the use of a material having high crystalline magnetocrystalline anisotropy enables the maintenance of thermal disturbance resistance and also enables both miniaturization and current reduction.

A storage layer and a reference layer of the MTJ element include magnetic layers, and emit magnetic fields to the outside. In general, in an MTJ element having a storage layer and a reference layer that are a perpendicular magnetization type, a leakage magnetic field generated from the reference layer is greater than that of the in-plane magnetization MTJ element. The storage layer lower in coercive force than the reference layer is strongly influenced by the leakage magnetic field from the reference layer. More specifically, problems caused by the influence of the leakage magnetic field from the reference layer include the decrease of thermal stability, and the increase in the value of a switching current that switches the magnetization direction of the storage layer and in the variation of this switching current value.

A method of providing a shift adjustment layer to cancel the leakage magnetic field from the reference layer has been proposed as a measure for reducing the leakage magnetic field applied to the storage layer from the reference layer in the perpendicular magnetization MTJ element. When a material having saturation magnetization substantially equal to that of the reference layer is used for the shift adjustment layer which cancels the leakage magnetic field from the reference layer, it is necessary to design the shift adjustment layer which cancels the leakage magnetic field to be larger in thickness than the reference layer. Accordingly, the problem is that element fabrication becomes difficult as a result of the increased thickness of the MTJ element.

BRIEF DESCRIPTION OF THE DRAWINGS

FIG. 1 is a sectional view of a magnetoresistive element according to a first embodiment;

FIGS. 2 and 3 are graphs showing the thickness of an upper shift layer and the thickness of a lower shift layer in the magnetoresistive element according to the first embodiment;

FIG. 4 is a circuit diagram showing the configuration of an MRAM according to a second embodiment;

FIG. 5 is a sectional view of a memory cell in the MRAM according to the second embodiment;

FIG. 6 is a block diagram showing a DSL data path unit of a DSL modem as an application example;

FIG. 10 is a sectional view of the card insertion type transfer apparatus as an application example;

FIG. 11 is a sectional view of a fitting type transfer apparatus as an application example; and FIG. 12 is a sectional view of a sliding type transfer apparatus as an application example.

DETAILED DESCRIPTION

Figure 7:
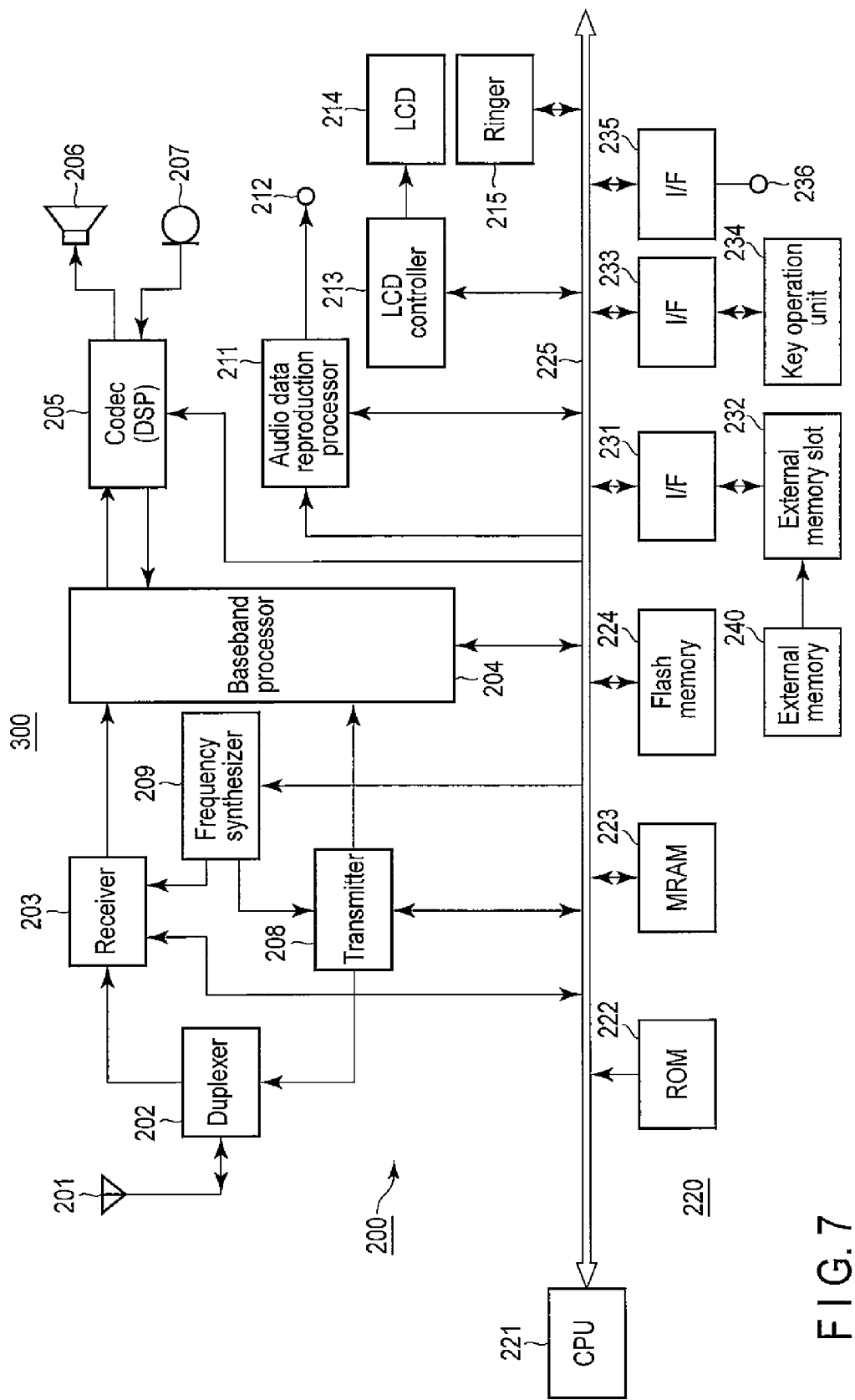
FIG. 7 is a block diagram showing a cell phone terminal as an application example.

Components having substantially the same functions and configurations are provided with the same reference signs in the following explanations and are repeatedly described only when necessary. It is to be noted that the drawings are schematic and that the relation between the thickness and planar dimensions, the ratio of the thickness of layers, etc. are different from real ones. Therefore, the following description should be considered to judge specific thickness and dimensions. It is also to be noted that the drawings include parts different in the relation and ratio of their dimensions.

In general, according to one embodiment, a magnetoresistive element includes a first magnetic layer, a second magnetic layer, a first nonmagnetic layer, a third magnetic layer, a fourth magnetic layer, a second nonmagnetic layer and a third nonmagnetic layer. The first magnetic layer has an axis of easy magnetization perpendicular to a film plane, and an invariable magnetization direction. The second magnetic layer has an axis of easy magnetization perpendicular to a film plane, and a variable magnetization direction. The first nonmagnetic layer is provided between the first magnetic layer and the second magnetic layer. The third magnetic layer is formed on a surface of the first magnetic layer, which is opposite to a surface on which the first nonmagnetic layer is formed. The third magnetic layer has a magnetization direction antiparallel to the magnetization direction of the first magnetic layer. The fourth magnetic layer is formed on a surface of the second magnetic layer, which is opposite to a surface on which the first nonmagnetic layer is formed. The fourth magnetic layer has a magnetization direction antiparallel to the magnetization direction of the first magnetic layer. The second nonmagnetic layer is located between the first magnetic layer and the third magnetic layer. The third nonmagnetic layer is located between the second magnetic layer and the fourth magnetic layer. The thickness of the fourth magnetic layer is smaller than the thickness of the third magnetic layer.

First Embodiment

FIG. 1 is a sectional view of a magnetoresistive element according to the first embodiment.

The magnetoresistive element according to the present embodiment is an MTJ element 1 having a single pin structure. The MTJ element 1 has a stack structure including a storage layer 2, a reference layer 3, a nonmagnetic layer 4, a nonmagnetic layer 5, an upper shift layer 6, a nonmagnetic layer 7, and a lower shift layer 8.

The storage layer 2, the reference layer 3, the upper shift layer 6, and the lower shift layer 8 are formed by magnetic layers. The nonmagnetic layer 4 is located between the storage layer 2 and the reference layer 3. The nonmagnetic layer 5 is located between the reference layer 3 and the upper shift layer 6. The nonmagnetic layer 7 is located between the storage layer 2 and the lower shift layer 8.

In other words, the MTJ element 1 has a stack structure in which the lower shift layer 8, the nonmagnetic layer 7, the storage layer 2, the nonmagnetic layer 4, the reference layer 3, the nonmagnetic layer 5, and the upper shift layer 6 are stacked in this order (stack structure in which the layers are formed in the order shown in FIG. 1). That is, the MTJ element 1 has a top pin structure. Alternatively, the MTJ element 1 may have a stack structure in which the lower shift layer 8, the nonmagnetic layer 7, the reference layer 3, the nonmagnetic layer 4, the storage layer 2, the nonmagnetic layer 5, and the upper shift layer 6 are stacked in this order (stack structure in which the layers are formed in the order shown in FIG. 1 and in which the storage layer 2 and the reference layer 3 are interchanged). That is, the MTJ element 1 may have a bottom pin structure.

The MTJ element 1 is what is known as a perpendicular magnetization MTJ element in which the magnetization directions of the storage layer 2, the reference layer 3, the upper shift layer 6, and the lower shift layer 8 are perpendicular to a film plane. That is, the storage layer 2, the reference layer 3, the upper shift layer 6, and the lower shift layer 8 have magnetic anisotropy substantially perpendicular to the film plane. Here, the "film plane" means the upper surface of each layer.

The storage layer 2 can be switched in magnetization direction by the action of spin-polarized electrons. The magnetizations of the reference layer 3 and the upper shift layer 6 are opposite and antiparallel to each other. The magnetizations of the reference layer 3 and the lower shift layer 8 are also opposite and antiparallel to each other. The upper shift layer 6 and the lower shift layer 8 reduce a leakage magnetic field applied to the storage layer 2 from the reference layer 3, that is, cancels the leakage magnetic field applied to the storage layer 2 from the reference layer 3.

When the nonmagnetic layer 4 is an insulator, the MTJ element 1 has a tunneling magnetoresistive (TMR) effect. When the nonmagnetic layer 4 is a metal, the MTJ element 1 has a giant magnetoresistive (GMR) effect. Here, when the nonmagnetic layer 4 is an insulator, magnesium oxide (MgO) or aluminum oxide (AlO, e.g. $Al_2O_3$), for example, is used. When the nonmagnetic layer 4 is a metal, Cu, Au, or Ag, for example, is used.

When materials having the same saturation magnetization Ms are used for the reference layer 3 and the upper shift layer 6 in the MTJ element having such a configuration, the leakage magnetic field applied to the storage layer 2 from the reference layer 3 cannot be totally counteracted if the thickness of the upper shift layer 6 is the same as the thickness of the reference layer 3. In order to totally counteract the leakage magnetic field applied to the storage layer 2, the thickness of the upper shift layer 6 needs to be larger than the thickness of the reference layer 3. Accordingly, the problem is that element fabrication becomes difficult as a result of the increased thickness of the MTJ element.

Thus, the present inventors have studied and found parameters necessary to counteract a film plane perpendicular component Hz of the leakage magnetic field applied to the storage layer 2. Here, to "counteract" means that the areal mean of the film plane perpendicular component Hz of the leakage magnetic field applied to the storage layer 2 is brought to zero.

The values of the parameters used in this analysis are as follows: The saturation magnetization Ms and thickness t of the storage layer 2 are Ms=670 ($emu/cm^3$) and t=1.7 nm, respectively. The saturation magnetization Ms1 and thickness t1 of the reference layer 3 are Ms1=760 ($emu/cm^3$) and t1=8.5 nm, respectively. Here, the thickness of the nonmagnetic layer 4 is 1.0 nm, the thickness of the nonmagnetic layer 5 is 1.0 nm, and the thickness of the nonmagnetic layer 7 is 1.0 nm.

The saturation magnetization Ms2 of the upper shift layer 6 is fixed at Ms2=940 ($emu/cm^3$). The saturation magnetization Ms3 of the lower shift layer 8 is changed to 752, 940, and 1128 ($emu/cm^3$). It should be understood that the magnetization directions of the storage layer 2, the upper shift layer 6, and the lower shift layer 8 are opposite to the magnetization direction of the reference layer 3.

FIG. 2 and FIG. 3 show calculations of the thickness of the upper shift layer 6 and the lower shift layer 8 necessary to eliminate the leakage magnetic field applied to the storage layer 2 in a stack structure in which the lower shift layer 8, the nonmagnetic layer 7, the storage layer 2, the nonmagnetic layer 4, the reference layer 3, the nonmagnetic layer 5, and the upper shift layer 6 are stacked in this order. In FIG. 2 and FIG. 3, the diameter R of the MTJ element having a columnar single pin structure is set at 40 nm and 30 nm, respectively.

The horizontal axis indicates the thickness of the upper shift layer 6, and the vertical axis indicates the thickness of the lower shift layer 8. In order to eliminate the leakage magnetic field applied to the storage layer 2, the thickness of the upper shift layer 6 needs to be about 30 nm when the thickness of the lower shift layer 8 is 0 to 1 nm. However, when the thickness of the lower shift layer 8 is 3.5 nm or more, the thickness of the upper shift layer 6 can be 10 nm or less.

That is, it is found out that the leakage magnetic field applied to the storage layer 2 can be eliminated by disposing the lower shift layer 8 even when the thickness of the upper shift layer 6 is small. It is also found out that the thickness of the upper shift layer 6 can be smaller when the thickness of the lower shift layer 8 is larger. The feature that the thickness of the upper shift layer can be smaller when the thickness of the lower shift layer is larger remains unchanged if the saturation magnetization of the upper shift layer 6 is the same as the saturation magnetization of the lower shift layer 8, if the saturation magnetization of the lower shift layer 8 is weaker than the saturation magnetization of the upper shift layer 6, and if the saturation magnetization of the lower shift layer 8 is stronger than the saturation magnetization of the upper shift layer 6.

Here, the thickness of the lower shift layer 8 is preferably smaller than the thickness of the upper shift layer 6 for the following reason. The lower shift layer 8 is located in the vicinity of the storage layer 2. Therefore, if the thickness of the lower shift layer 8 is larger, the influence of the magnetic field on the storage layer is greater, which leads to such a problem that makes it more difficult for the magnetization in the storage layer 2 to switch. Thus, the optimum thickness of the upper shift layer 6 and the lower shift layer 8 is selected, for example, from an area on the lower right of a broken line of y=x shown in FIG. 2 and FIG. 3. Consequently, the thickness of the lower shift layer 8 is made smaller than the thickness of the upper shift layer 6, and the optimum thickness of the upper shift layer 6 and the lower shift layer 8 is selected, so that it is possible to manufacture an element in which the leakage magnetic field applied to the storage layer 2 from the reference layer 3 is reduced.

As described above, the thickness of the lower shift layer 8 is made smaller than the thickness of the upper shift layer 6, and the optimum thickness of the upper shift layer 6 and the lower shift layer 8 is selected, so that it is possible to reduce the leakage magnetic field applied to the storage layer 2 from the reference layer 3 and reduce the variations of the switching current value and a write current. Moreover, the total thickness of the magnetoresistive element can be reduced, that is, the manufacturing costs can be reduced by the reduction in the thickness of the magnetoresistive element.

According to the present embodiment, the thickness of the magnetic layer (shift adjustment layer) used for canceling the leakage magnetic field applied to the storage layer 2 from the reference layer 3 can be reduced. As a result, the thickness of the magnetoresistive element can be reduced, and the manufacturing costs can be reduced. Further, it is possible to reduce the value of the switching current that switches the magnetization direction of the storage layer and the variation of this switching current value.

Now, magnetic materials having perpendicular magnetic anisotropy used for the storage layer 2, the reference layer 3, the upper shift layer 6, and the lower shift layer 8 in the first embodiment are described. The following materials are used as the perpendicular magnetization material for the MTJ element according to the present embodiment.

(1) Ordered Alloys

It is possible to use an ordered alloy having an $L1_0$ structure based on a face-centered tetragonal (fct) structure oriented to a (001) face in an in-film-plane direction.

An ordered alloy having an $L1_0$ crystal structure may be used as the magnetic material for the storage layer 2 and the reference layer 3. Such an alloy includes one or more of iron (Fe), cobalt (Co), nickel (Ni), and manganese (Mn), and one or more of platinum (Pt), palladium (Pd), rhodium (Rh), and aluminum (Al). For example, such an ordered alloy includes $Fe_{50}Pt_{50}$, $Fe_{50}Pd_{50}$, $Co_{50}Pt_{50}$, $Fe_{30}Ni_{20}Pt_{50}$, $Fe_{50}Pt_{30}Rh_{20}$, $Co_{30}Ni_{20}Pt_{50}$, and $Mn_{50}Al_{50}$. The composition ratios in these alloys are illustrative only and are not limited.

The magnetic anisotropy energy density and the saturation magnetization can be reduced by adding, to these ordered alloys, a single impurity element such as copper (Cu), zinc (Zn), silver (Ag), nickel (Ni), cobalt (Co), iron (Fe), manganese (Mn), chromium (Cr), vanadium (V), titanium (Ti), osmium (Os), iridium (Ir), and boron (B) or an alloy of these elements, or an insulator. The composition ratio can be adjusted to use a mixed layer of an ordered alloy having an $L1_0$ structure and an ordered alloy having an $L1_2$ structure.

(2) Disordered Alloys

It is possible to use a disordered alloy which includes cobalt (Co) as the main component and which includes one or more of chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). The disordered alloys include, for example, a CoCr alloy, a CoPt alloy, a CoCrTa alloy, a CoCrPt alloy, a CoCrPtTa alloy, and a CoCrNb alloy. The magnetic anisotropy energy density and the saturation magnetization of these alloys can be adjusted by increasing the ratio of a nonmagnetic element.

(3) Artificial Lattice

Artificial lattice used includes a stack film alternately having an alloy which includes at least one of iron (Fe), cobalt (Co), and nickel (Ni) and an alloy which includes at least one of chromium (Cr), platinum (Pt), palladium (Pd), iridium (Ir), rhodium (Rh), ruthenium (Ru), osmium (Os), rhenium (Re), gold (Au), and copper (Cu). For example, such artificial lattice includes Co/Pt artificial lattice, Co/Pd artificial lattice, CoCr/Pt artificial lattice, Co/Ru artificial lattice, Co/Os artificial lattice, Co/Au artificial lattice, and Ni/Cu artificial lattice. The magnetic anisotropy energy density and the saturation magnetization of such artificial lattice can be adjusted by adjusting the addition of an element to the magnetic layer and the thickness ratio between the magnetic layer and the nonmagnetic layer.

(4) Heavy Rare Earth Metal

A magnetic body including an alloy of a heavy rare earth metal and a transition metal can be used. For example, it is possible to use an amorphous alloy which includes terbium (Tb), dysprosium (Dy), or gadolinium (Gd), and at least one element among transition metals. Alternatively, it is possible to use an alloy which includes samarium (Sm), neodymium (Nd), dysprosium (Dy), and at least one element among transition metals. For example, such an alloy includes TbFe, TbCo, TbFeCo, DyTbFeCo, GdTbCo, SmCo, NdCo, and DyCo. The magnetic anisotropy energy density and the saturation magnetization of these alloys can be adjusted by adjusting the composition ratio.

A magnetoresistive element having a high MR ratio may be formed by using, for the storage layer 2 and the reference layer 3, a stack film sandwiched CoFeB, CoFe or Fe having high polarizability at the interfaces where the storage layer 2 or the reference layer 3 contact the nonmagnetic layer 4. If the upper shift layer 6 and the lower shift layer 8 are made of the same material, the magnetoresistive element can be easily manufactured.

A metal including at least one of Mo, Nb, Ta, W, Ir, Rh, Os, Re, and Ru can be used as the material for the nonmagnetic layers 5 and 7.

Second Embodiment

Now, a magnetic random access memory (MRAM) according to the second embodiment is described with reference to FIG. 4 and FIG. 5. The MRAM according to the second embodiment is configured to use the magnetoresistive element according to the first embodiment as a storage element. In the embodiment described below, the magnetoresistive element 1 according to the first embodiment is used as a magnetoresistive element.

FIG. 4 is a circuit diagram showing the configuration of the MRAM according to the second embodiment.

The MRAM according to the second embodiment includes a memory cell array 40 having memory cells MC arranged in matrix form. Pairs of bit lines BL, /BL are provided in the memory cell array 40 to extend in a column direction. Word lines WL are also provided in the memory cell array 40 to extend in a row direction.

A memory cell MC is located at the intersection of the bit line BL and the word line WL. Each memory cell MC includes the magnetoresistive element 1 and a select transistor (e.g. n-channel MOS transistor) 41. One end of the magnetoresistive element 1 is connected to the bit line BL. The other end of the magnetoresistive element 1 is connected to the drain terminal of the select transistor 41. The source terminal of the select transistor 41 is connected to the bit line /BL. The gate terminal of the select transistor 41 is connected to the word line WL.

A row decoder 42 is connected to the word line WL. A write circuit 44 and a read circuit 45 are connected to the pairs of bit lines BL, /BL. A column decoder 43 is connected to the write circuit 44 and the read circuit 45. Each memory cell MC is selected by the row decoder 42 and the column decoder 43.

Data is written into the memory cell MC as follows. First, in order to select a memory cell MC to write data into, the word line WL connected to this memory cell MC is activated. As a result, the select transistor 41 is turned on.

Here, a bi-directional write current Iw is supplied to the magnetoresistive element 1 in accordance with the data to be written. More specifically, when the write current Iw is supplied to the magnetoresistive element 1 from left to right, the write circuit 44 applies a positive voltage to the bit line BL, and applies a ground voltage to the bit line /BL. When the write current Iw is supplied to the magnetoresistive element 1 from right to left, the write circuit 44 applies a positive voltage to the bit line /BL, and applies a ground voltage to the bit line BL. In this way, data "0" or data "1" can be written into the memory cell MC.

Data is read from the memory cell MC as follows. First, the select transistor 41 of a memory cell MC to be selected is turned on. The read circuit 45 supplies the magnetoresistive element 1 with, for example, a read current Ir running from right to left, that is, supplies the read current Ir from the bit line /BL to the bit line BL. The read circuit 45 detects the resistance value of the magnetoresistive element 1 in accordance with the read current Ir. Further, the read circuit 45 reads data stored in the magnetoresistive element 1 from the detected resistance value.

Now, the structure of the MRAM according to the embodiment is described with reference to FIG. 5. FIG. 5 is a sectional view showing the structure of one memory cell MC.

As shown, the memory cell MC has the magnetoresistive element (MTJ) 1 and the select transistor 41. An element isolation insulating layer 46 is provided in the surface area of a p-type semiconductor substrate 51. The surface area of the semiconductor substrate 51 in which the element isolation insulating layer 46 is not provided is an element area (active area) in which elements are formed. The element isolation insulating layer 46 includes, for example, shallow trench isolation (STI). For example, silicon oxide is used for the STI.

A source area S and a drain area D that are separated from each other are formed in the element area of the semiconductor substrate 51. The source area S and the drain area D include N+ type diffusion areas formed by introducing a high-concentration impurity, for example, an N+ type impurity into the semiconductor substrate 51.

A gate insulating film 41A is formed on the semiconductor substrate 51 between the source area S and the drain area D. A gate electrode 41B is formed on the gate insulating film 41A. This gate electrode 41B functions as the word line WL. Thus, the select transistor 41 is provided on the semiconductor substrate 51.

An interconnect layer 53 is formed on the source area S via a contact 52. The interconnect layer 53 functions as the bit line /BL. A leader line 55 is formed above the drain area D via a contact 54. The magnetoresistive element 1 intervening between a lower electrode 10 and an upper electrode 9 is provided above the leader line 55. An interconnect layer 56 is formed on the upper electrode 9. The interconnect layer 56 functions as the bit line BL. The space between the semiconductor substrate 51 and the interconnect layer 56 is filled with an interlayer insulating film 57 made of, for example, silicon oxide.

As described above in detail, according to the second embodiment, an MRAM can be configured by using the magnetoresistive element 1. The magnetoresistive element 1 can be used not only as a spin transfer torque writing type magnetic memory but also as a magnetic domain wall motion magnetic memory.

The MRAM shown in the second embodiment is applicable to various devices. Several applications of the MRAM are described below.

[1] Application 1

FIG. 6 shows an extracted DSL data path unit of a digital subscriber line (DSL) modem.

This modem includes, for example, a programmable digital signal processor (DSP) 100, an analog-digital (A/D) converter 110, a digital-analog (D/A) converter 120, a transmission driver 130, and a receiver amplifier 140.

A band pass filter is not shown in FIG. 6. Instead, an MRAM 170 according to the second embodiment and an electrically erasable and programmable ROM (EEPROM) 180 are shown as various types of optional memories for holding a line code program (program which is executed by the DSP and which selects and operates the modem in accordance with, for example, coded subscriber's line information and transmission conditions (line code: QAM, CAP, RSK, FM, AM, PAM, or DWMT).

Although two kinds of memories: the MRAM 170 and the EEPROM 180 are used as the memories for holding the line code program in this application, the EEPROM 180 may be replaced by an MRAM. That is, the MRAM alone may be used instead of using two kinds of memories.

[2] Application 2

FIG. 7 shows a cell phone terminal 300 as another application.

A communication section 200 that enables a communication function includes, for example, a sending/receiving antenna 201, an antenna duplexer 202, a receiver 203, a baseband processor 204, a digital signal processor (DSP) 205 used as an audio codec, a speaker (receiver) 206, a microphone (transmitter) 207, a transmitter 208, and a frequency synthesizer 209.

The cell phone terminal 300 is also provided with a control section 220 for controlling the components of the cell phone terminal 300. The control section 220 is a microcomputer which is formed by connecting a CPU 221, a ROM 222, an MRAM 223 according to the second embodiment, and a flash memory 224 via a bus 225.

Programs to be executed by the CPU 221 and necessary display data such as fonts are stored in the ROM 222 in advance.

The MRAM 223 is mainly used as a work area, and is used by the CPU 221 to store, as needed, data being calculated during the execution of the program, or used to temporarily store data exchanged between the control section 220 and each component.

The flash memory 224 is used to store setting parameters so that even if the cell phone terminal 300 is powered off, conditions set immediately before the power-off are stored to enable the same setting when the cell phone terminal 300 is powered on next. This prevents the disappearance of the stored setting parameters even if the cell phone terminal 300 is powered off.

The cell phone terminal 300 is also provided with an audio data reproduction processor 211, an external output terminal 212, an LCD controller 213, a liquid crystal display (LCD) 214 for display, and a ringer 215 which generates a ringing tone.

The audio data reproduction processor 211 reproduces audio data input to the cell phone terminal 300 (or audio information (audio data) stored in a later-described external memory 240). The reproduced audio data (audio information)

can be transmitted to a headphone or a mobile speaker via the external output terminal 212 and thereby taken out.

Thus, the audio information can be reproduced by providing the audio data reproduction processor 211. The LCD controller 213 receives, for example, display information from the CPU 221 via the bus 225, converts the display information to LCD control information for controlling the LCD 214, and drives the LCD 214 to display the information.

Furthermore, the cell phone terminal 300 is provided with interface circuits (I/F) 231, 233, and 235, the external memory 240, an external memory slot 232, a key operation unit 234, and an external input/output terminal 236. The external memory 240, for example, a memory card is inserted into the external memory slot 232. The external memory slot 232 is connected to the bus 225 via the interface circuit (I/F) 231.

The slot 232 is thus provided in the cell phone terminal 300 such that information in the cell phone terminal 300 can be written into the external memory 240 or information (e.g. audio information) stored in the external memory 240 can be input to the cell phone terminal 300.

The key operation unit 234 is connected to the bus 225 via the interface circuit (I/F) 233. Key input information input from the key operation unit 234 is transmitted to, for example, the CPU 221. The external input/output terminal 236 is connected to the bus 225 via the interface circuit (I/F) 235. The external input/output terminal 236 functions as a terminal for inputting various kinds of information to the cell phone terminal 300 from the outside or outputting information from the cell phone terminal 300 to the outside.

Although the ROM 222, the MRAM 223, and the flash memory 224 are used in this application, the flash memory 224 may be replaced by an MRAM, and the ROM 222 can also be replaced by an MRAM.

[3] Application 3

FIG. 8 to FIG. 12 respectively show examples of how the MRAM is applied to cards (MRAM cards) such as smart media for storing media content.

Figure 8:
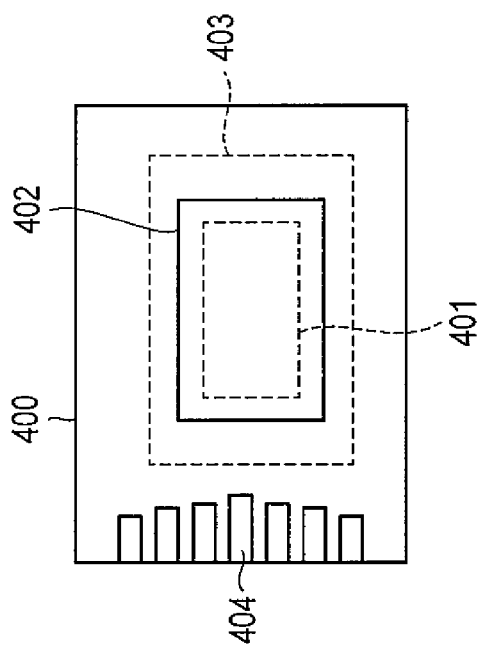
FIG. 8 is a top view of an MRAM card as an application example.

As shown in FIG. 8, an MRAM card body 400 has an MRAM chip 401 therein. The card body 400 has an opening 402 formed in a position corresponding to the MRAM chip 401 so that the MRAM chip 401 is exposed. This opening 402 is provided with a shutter 403 so that the MRAM chip 401 is protected by the shutter 403 when the MRAM card is carried. The shutter 403 is made of a material such as ceramics having the effect of blocking an external magnetic field.

In order to transfer data, the shutter 403 is opened to expose the MRAM chip 401. An external terminal 404 takes out content data stored in the MRAM card.

Figure 9:
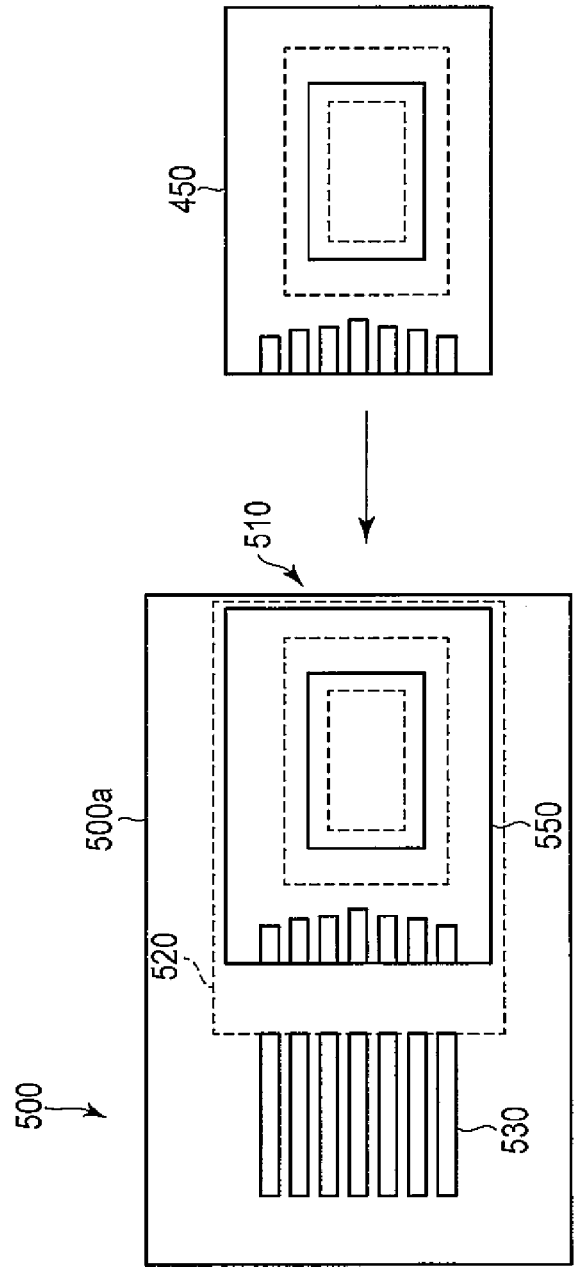
FIG. 9 is a plan view of a card insertion type transfer apparatus as an application example.

FIG. 9 and FIG. 10 show a card insertion type transfer device for transferring data to the MRAM card.

A data transfer device 500 has a storage portion 500a. A first MRAM card 550 is stored in the storage portion 500a. The storage portion 500a is provided with an external terminal 530 which is electrically connected to the first MRAM card 550. This external terminal 530 is used to rewrite data in the first MRAM card 550.

A second MRAM card 450 used by an end user is inserted from an insertion portion 510 of the data transfer device 500 as indicated by an arrow, and pushed in until stopped by a stopper 520. This stopper 520 also serves as a member to align the first MRAM card 550 with the second MRAM card 450. When the second MRAM card 450 is located in a predetermined position, a control signal is supplied to the external terminal 530 from a first MRAM data rewrite controller unit, and data stored in the first MRAM card 550 is transferred to the second MRAM card 450.

FIG. 11 is a sectional view showing a fit type transfer device for transferring data to the MRAM card.

A transfer device 600 is a type that mounts the second MRAM card 450 on the first MRAM card 550 in a fitting manner using the stopper 520 as a mark, as indicated by an arrow. The transfer method is the same as that of the card insertion type and is therefore not described.

FIG. 12 is a sectional view showing a slide type transfer device for transferring data to the MRAM card.

A transfer device 700 is provided with a tray slide 560 as in a CD-ROM drive or a DVD drive. This tray slide 560 moves as indicated by an arrow. When the tray slide 560 has moved to the position indicated by a broken line, the second MRAM card 450 is mounted on the tray slide 560, and the tray slide 560 then moves to convey the second MRAM card 450 into the transfer device 700.

The slide type transfer device is the same as the card insertion type transfer device in that the second MRAM card 450 is conveyed so that the tip of the second MRAM card 450 comes into contact with the stopper 520, and in the transfer method. Therefore, no explanations are given in these respects.

The MRAM described in the second embodiment can be used in a file memory capable of high-speed random writing, a mobile terminal capable of high-speed downloading, a mobile player capable of high-speed downloading, a semiconductor memory for broadcasting devices, a drive recorder, a home video, a high-capacity buffer memory for communication, and a semiconductor memory for a security camera, thus providing many industrial advantages.

As described above, according to the embodiments, it is possible to provide a magnetoresistive element which allows the reduction in the thickness of a magnetic layer (shift adjustment layer) used to cancel a leakage magnetic field applied to a storage layer, and also provide a magnetic memory that uses such a magnetoresistive element. Moreover, it is possible to provide a spin transfer torque writing type magnetoresistive element which allows the reduction in the value of a switching current that switches the magnetization direction of a storage layer and in the variation of this switching current value, and also provide a magnetic memory that uses such a magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer having an axis of easy magnetization perpendicular to a film plane, and an invariable magnetization direction;
   a second magnetic layer having an axis of easy magnetization perpendicular to a film plane, and a variable magnetization direction;
   a first nonmagnetic layer provided between the first magnetic layer and the second magnetic layer;
   a third magnetic layer formed on a surface of the first magnetic layer, which is opposite to a surface on which the first nonmagnetic layer is formed, the third magnetic layer comprising a magnetization direction antiparallel to the magnetization direction of the first magnetic layer:

a fourth magnetic layer formed on a surface of the second magnetic layer, which is opposite to a surface on which the first nonmagnetic layer is formed, the fourth magnetic layer comprising a magnetization direction antiparallel to the magnetization direction of the first magnetic layer:

a second nonmagnetic layer located between the first magnetic layer and the third magnetic layer; and a third nonmagnetic layer located between the second magnetic layer and the fourth magnetic layer, wherein the thickness of the fourth magnetic layer is smaller than the thickness of the third magnetic layer, and the third magnetic layer and the fourth magnetic layer are made of the same material.

2. The magnetoresistive element according to claim 1, wherein
the second nonmagnetic layer and the third nonmagnetic layer comprise a metal including at least one of molybdenum (Mo), niobium (Nb), tantalum (Ta), tungsten (W), iridium (Ir), rhodium (Rh), osmium (Os), rhenium (Re), and ruthenium (Ru).

3. The magnetoresistive element according to claim 1, wherein
the first magnetic layer and the second magnetic layer comprise an ordered alloy which includes at least one of iron (Fe), cobalt (Co), nickel (Ni), and manganese (Mn) and at least one of platinum (Pt), palladium (Pd), rhodium (Rh), and aluminum (Al) and which has an $L1_0$ crystal structure.

4. The magnetoresistive element according to claim 1, wherein
at least one of the first, second, third, and fourth magnetic layers comprises a disordered alloy which includes cobalt (Co) as the main component and which includes at least one of chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni).

5. The magnetoresistive element according to claim 1, wherein
at least one of the first, second, third, and fourth magnetic layers comprises a stack film alternately having an alloy which includes at least one of iron (Fe), cobalt (Co), and nickel (Ni) and an alloy which includes at least one of chromium (Cr), platinum (Pt), palladium (Pd), iridium (Ir), rhodium (Rh), ruthenium (Ru), osmium (Os), rhenium (Re), gold (Au), and copper (Cu).

6. The magnetoresistive element according to claim 1, wherein
at least one of the first, second, third, and fourth magnetic layers comprises an alloy of a heavy rare earth metal and a transition metal.

7. The magnetoresistive element according to claim 1, wherein
the first nonmagnetic layer comprises one of magnesium oxide and aluminum oxide.

8. The magnetoresistive element according to claim 1, wherein
the first nonmagnetic layer comprises at least one of copper (Cu), gold (Au), and silver (Ag).

9. The magnetoresistive element according to claim 1, wherein
the thickness of the fourth magnetic layer is 3.5 nm or more, and the thickness of the third magnetic layer is 10 nm or less.

10. A magnetic memory according to claim 1, comprising:
a memory cell including the magnetoresistive element, and
first and second electrodes applying electricity to the magnetoresistive element.

11. The magnetic memory according to claim 10, further comprising:
a first interconnect electrically connected to the first electrode;
a second interconnect electrically connected to the second electrode; and
a write circuit which is electrically connected to the first interconnect and the second interconnect and which bi-directionally supplies a current to the magnetoresistive element.

12. The magnetic memory according to claim 10, further comprising:
a select transistor connected between the second electrode of the magnetoresistive element and the second interconnect; and
a third interconnect which controls the on/off of the select transistor.

13. The magnetoresistive element according to claim 1, wherein
the first nonmagnetic layer is a tunnel barrier layer.

14. The magnetoresistive element according to claim 1, wherein
a change in magnetoresistance through the first nonmagnetic layer is larger than a change in magnetoresistance through one of the second and third nonmagnetic layers.

* * * * *